(12) United States Patent
O'Riordan et al.

(10) Patent No.: US 9,355,130 B1
(45) Date of Patent: May 31, 2016

(54) METHOD AND SYSTEM FOR COMPONENT PARAMETER MANAGEMENT

(75) Inventors: Donald J. O'Riordan, Sunnyvale, CA (US); James McMahon, Singapore (SG)

(73) Assignee: CADENCE DESIGN SYSTEMS, INC., San Jose, CA (US)

( * ) Notice: Subject to any disclaimer, the term of this patent is extended or adjusted under 35 U.S.C. 154(b) by 209 days.

(21) Appl. No.: 13/559,428

(22) Filed: Jul. 26, 2012

(51) Int. Cl.
*G06F 17/30* (2006.01)

(52) U.S. Cl.
CPC ............................... *G06F 17/30306* (2013.01)

(58) Field of Classification Search
CPC ................................................ G06F 17/30306
USPC ............ 707/707, 709, 712, 759, 769; 716/30, 716/50, 100, 101, 105
See application file for complete search history.

(56) References Cited

U.S. PATENT DOCUMENTS

| | | | |
|---|---|---|---|
| 6,169,992 B1* | 1/2001 | Beall et al. | |
| 7,376,644 B2* | 5/2008 | Chen | G06F 17/30398 |
| 7,882,110 B2* | 2/2011 | Bahr | G06F 17/30011 707/741 |
| 8,046,424 B2* | 10/2011 | Novik | G06F 17/30176 707/620 |
| 2006/0122724 A1* | 6/2006 | Croke et al. | 716/21 |
| 2008/0091981 A1* | 4/2008 | Dokken et al. | 714/45 |
| 2011/0107252 A1* | 5/2011 | Balaram et al. | 716/139 |

* cited by examiner

*Primary Examiner* — Marc Filipczyk
(74) *Attorney, Agent, or Firm* — Kenyon & Kenyon LLP

(57) ABSTRACT

Electronic Design Automation software displays parameters of a component in a graphical user interface. According to an embodiment, parameters of a component may be filtered through the use of a query. A Component Parameter Manager may search through parameter fields in a CDF file for components that match the query and emphasize the matching parameters in a graphical user interface. The parameter fields in a CDF file may also be augmented by a separate file to add search instructions or additional parameter fields. The augmentation helps facilitate a search by the Component Parameter Manager. The augmentations to a CDF file may be provided in a editable file separate from the CDF file.

25 Claims, 6 Drawing Sheets

METHOD AND SYSTEM FOR COMPONENT PARAMETER MANAGEMENT

FIELD

Aspects of the present invention relate generally to Electronic Design Automation (EDA) software.

BACKGROUND

When creating an Integrated Circuit ("IC") design using EDA software, designers may use predetermined manufacturer-supplied components in a Process Design Kit ("PDK") to create a design. A subset of the PDK is a Component Description Format ("CDF") information set. A CDF describes attributes of individual components and libraries of components in the PDK, as one aspect of EDA software. A CDF may be attached to either a cell or a library of components. A CDF attached to a cell may describe the parameters and attributes for that one particular component. A CDF attached to a library may describe the parameters and attributes for all the components in the library. CDF information is often stored in one or more files which are referenced by/included within a PDK. Different EDA software companies may support their own version of a CDF, though by a different name, and perhaps with different characteristics. For example, Cadence has its own proprietary CDF, Open PDK has its own version of a CDF, and iPDK has its own version of the CDF called iCDF. These CDFs are only provided as examples, and are not meant to be an exhaustive list of all the different CDFs. Additionally, other CDFs may be developed in the future. One of ordinary skill in the art will be able to determine whether a certain information set is a CDF. For convenience in this description, "CDF" will refer to any information set that is used to describe components, cells, library of components, or library of cells.

Currently, EDA software manages component parameters by providing a Graphical User Interface ("GUI") which lists all the parameters of a selected component in a scrollable window. As semiconductor manufacturing processes have moved to ever-smaller geometries, the number of parameters relating to a particular semiconductor component has increased. For example, a component based on a 28 nm manufacturing process may have 300 parameters. The number of parameters will only increase as manufacturing processes move to ever smaller geometries. It is cumbersome for someone to identify, set, and/or inspect parameters for a particular component when there are hundreds of parameters to sift through.

For example, because there are so many parameters, all the parameters cannot be listed in an easily ascertainable fashion. Currently, as explained above, applications provide users with a scroll bar to help navigate the list. However, it has become cumbersome and time consuming for a user to scroll through all the parameters now that there are hundreds of parameters for a component.

Additionally, different PDK's—PDKs from different manufacturers and/or PDKs representing different process generations—may use widely different terminology, nomenclature, and/or case sensitivity for a given property or group of properties. This further increases the cognitive burden on an IC designer/user when dealing with multiple PDKs or switching from one manufacturing process (or generation) to another. The designer must struggle to remember the different nomenclatures when manually scrolling through large numbers of parameter to find a specific parameter or group of parameters.

As a result, it would be desirable to provide a method and system to simplify these actions as well as provide a better parameter management system.

SUMMARY

This description provides a system, method, and computer program product for managing parameters of a semiconductor component in electronic design automation (EDA) software. While operating the EDA software, embodiments may augment a received query with at least a first search instruction stored in a first file. Embodiments may augment a Component Description Format (CDF) file by the first file so that the augmented CDF file contains at least one additional field. The CDF file may be stored on a non-transitory computer readable medium, describe the component parameters, and contain parameter fields that have programming code that interacts with the EDA software to control execution of the query. Embodiments may perform the augmented query in at least one field in the augmented CDF file. Embodiments may determine whether there is at least one matching parameter within the component parameters based on the query, and if there are any matching parameters, may emphasize the matching parameters on a display.

DETAILED DESCRIPTION

Figure 1:
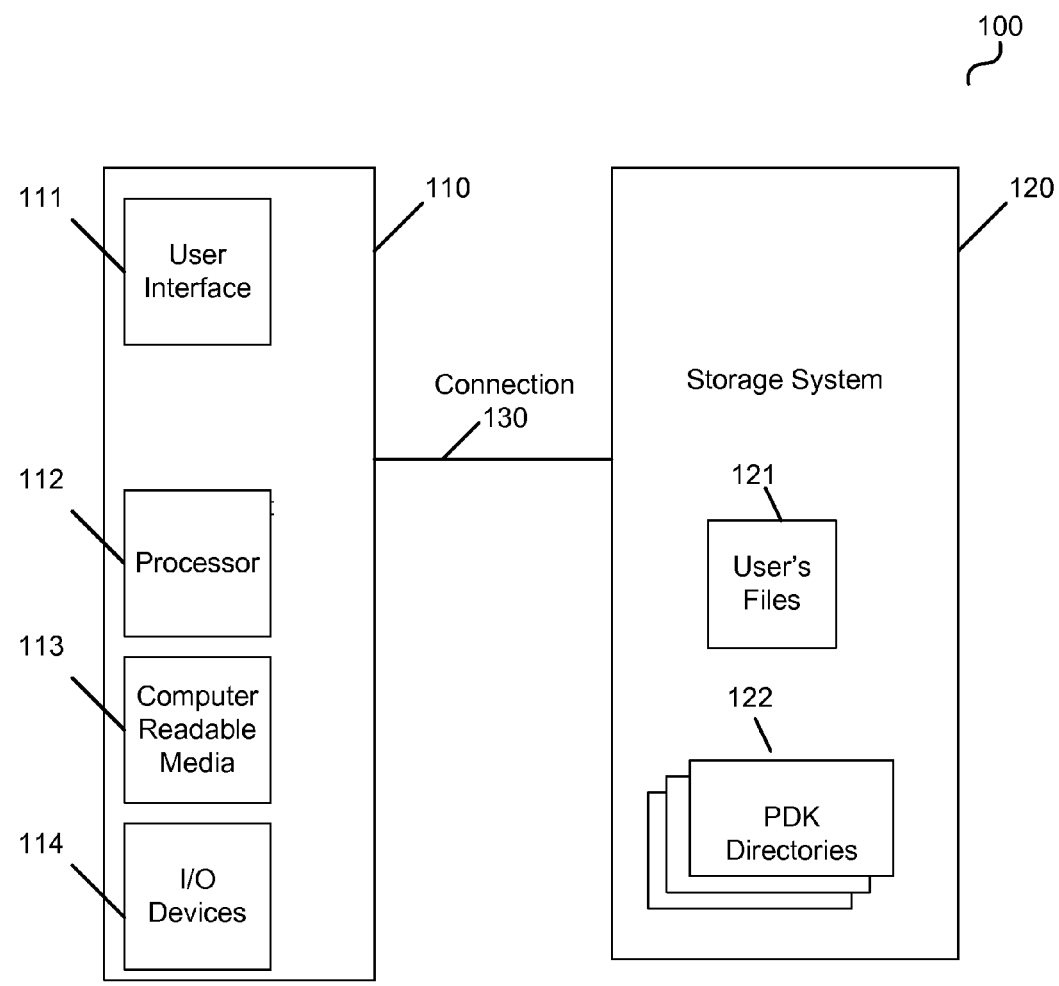
FIG. 1 is a block diagram illustrating components of an exemplary parameter-filtering system according to an embodiment.

Each parameter of a component may describe an aspect of that particular component. Looking at an exemplary component such as a resistor, a resistor may have a parameter such as "ideal" which, when invoked, will make the resistor behave in a theoretical perfect fashion. Another parameter such as "thin film," when selected, may impose a particular design on the resistor. Other parameters may include width, length, and resistivity type. In one aspect, selecting the "thin film" parameter may provide a thin film resistor with user provided width, length, and resistivity type.

Parameters may have one or more attributes that impose features and limitations on the parameters. An example of an attribute may be the requirement that the values of the parameter be in Boolean format (1 or 0).

The CDF information set may describe each parameter by providing, among other things, a name, default values, a list of choices (such as whether it is thin film or ideal), and a type (such as whether a parameter is to be in Boolean, floating point, string, integer, etc.) for the parameter. Each parameter description within the CDF file may be held in its own field ("parameter field"). In one aspect of an embodiment, the parameter fields may be a comma separated value list and the description type may be determined by the order in which the description is provided in that list. A comma separated value list for a resistor may be as follows: "Name, Thin Film or Ideal, Default value." Instead of a comma-separated format, other serialization format may be used, including but not limited to, Extensible Markup Language (XML), JavaScript Object Notation (JSON), SKILL, Tool Command Language (Tcl), Python, and other programming languages. Independent of the format used, the descriptions in the fields and the number of fields used may vary from one CDF type to another. Some of the parameter fields may also have programming code that interacts with EDA software. Because most EDA software interacts with the OpenAccess database, it is currently best to use programming languages that have bindings or application programming interfaces (APIs) to OpenAccess. Currently OpenAccess bindings have been created for (or are soon to be created for) SKILL, Tcl, Python, Perl, Ruby, C++, and C#. As bindings to OpenAccess are developed for other programming languages, those programming languages may also be used in the parameter fields to interact with EDA software. If databases other than OpenAccess are used with EDA software, those programming languages which have bindings to the other databases may be used.

Table 1 (below) shows an example of the CDF fields supported in a typical EDA software tool.

TABLE 1

| CDF Field Listing | |
|---|---|
| Field | Description |
| Name | Short name of parameter |
| Prompt | Single line Longer name used as a GUI "hint" |
| Default Value | Default value of parameter |
| Choices | List of choices for enumerated types |
| Type | Type of parameter/corresponding GUI element |
| Display Expression | Programming code that determines display visibility of this parameter |
| Editable Expression | Programming code that determines editability of this parameter (non-editable parameters are essentially temporary variables often containing intermediate expression results) |
| Callback Expression | An expression/function in programming code which is called whenever the parameter value is interactively edited in the GUI |

With recent process nodes, components with hundreds of parameters have become common. As noted, as geometries get smaller, the number of parameters will increase. A person of ordinary skill in the art would recognize that there are many more types of components, parameters, and attributes than the ones referred to above.

According to an embodiment, a parameter-filtering system integrated within EDA software may be used to aid designers in identifying and manipulating parameters of components. In one aspect, rather than having to scroll through hundreds of parameters, the parameter-filtering system searches through the parameter fields to identify matching parameters.

A user may access the parameter-filtering system through a standalone-client system, client-server environment, or a network environment. FIG. 1 is a block diagram illustrating components of an exemplary parameter-filtering system 100 according to an embodiment. System 100 may comprise a computer system 110, a storage system 120, and a connection 130.

Computer system 110 may execute instructions stored on a computer readable medium that provides a user interface 111 which allows a user to access storage system 120. According to an aspect of an embodiment, the instructions may be part of a software program or executable file that operates EDA software. Computer system 110 may be any computing system, such as a personal computer, workstation, or other device employing one or more processors that can execute programming instructions stored on one or more computer readable media. In one embodiment, computer system 110 has a processor 112 that is able to execute programming instructions stored on one or more computer readable media 113 and/or storage system 120. Computer readable media 113 and storage system 120 may include one or more compact disks, optical disks, hard drives, flash memory, magnetic strips, RAM, ROM, and other computer readable media. User interface 111 may be a GUI run in a user-controlled application window on a display. A user may interact with user interface 111 through one or more I/O devices 114 such as a keyboard, a mouse, or a touch screen, etc.

Storage system 120 may take any number of forms, including but not limited to a server with one or more storage devices attached to it, a storage area network, or one or a plurality of non-transitory computer readable media. In an aspect of one embodiment, PDK directories 122, which may include CDF files, and separate User's Files 121 may be stored in storage system 120 such that they may be persistent, retrieved, or edited by the user. In another embodiment such files may be held in one or more of the computer readable media 113 or a combination of both computer readable media 113 and storage system 120.

According to an aspect of an embodiment, only one computer system 110 is connected to storage system 120 through connection 130, which may be a simple direct wired or wireless connection, a system bus, a network connection, or the like, to provide computer system 110 with access to storage system 120. In one aspect, connection 130 may enable multiple clients to connect to storage system 120. The network connection may be a local area network, a wide area network, or any other type of network providing one or more clients 110 with access to storage system 120. The clients' degree of access may depend on system administrator settings, user settings, etc.

Figure 2:
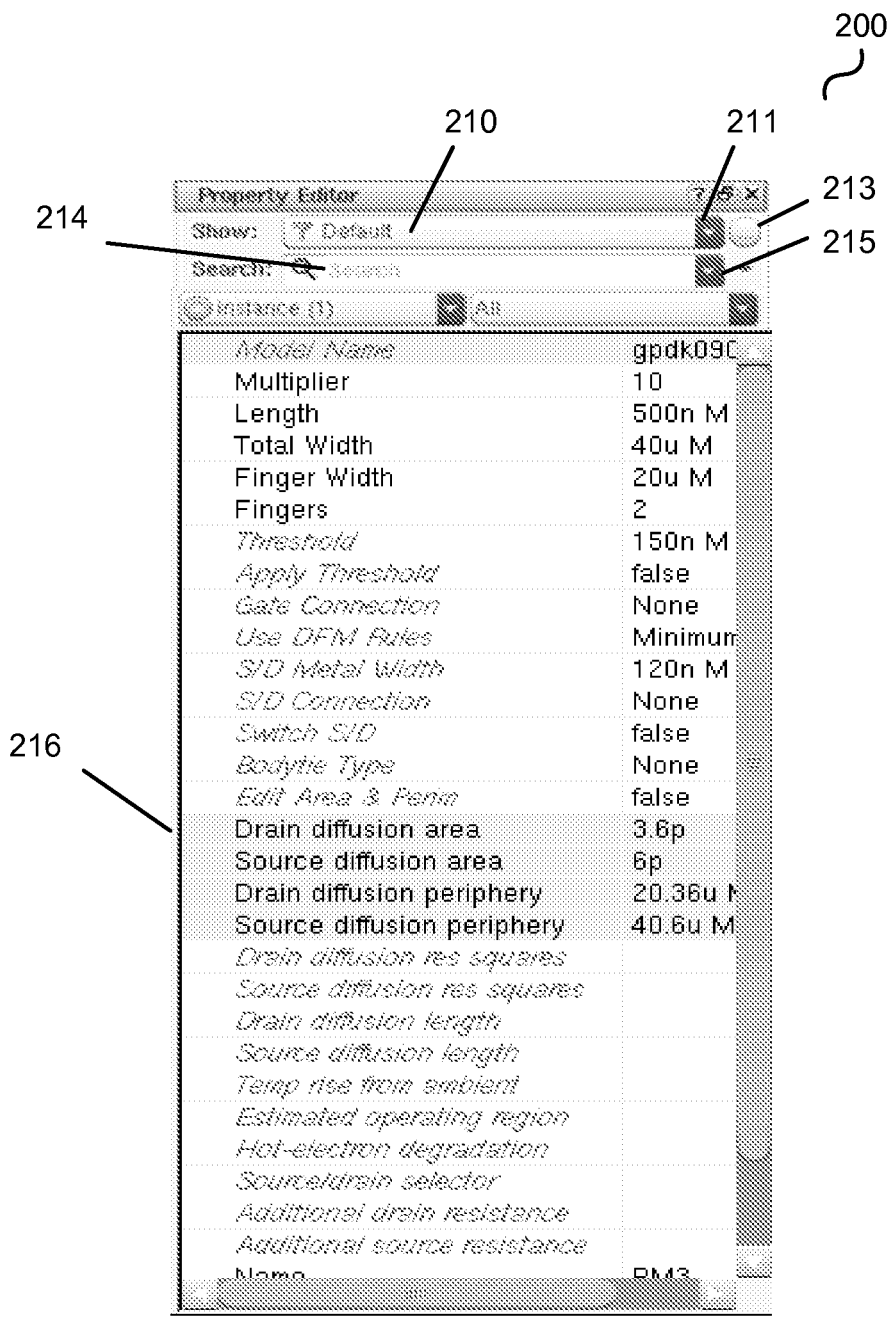
FIG. 2 is an exemplary Graphical User Interface of a parameter-filtering system according to an embodiment.

FIG. 2 illustrates an exemplary GUI 200 according to an embodiment. GUI 200 may have filter-display field 210, filter-list button 211, create-filter button 213, search field 214, limit-search button 215, and parameter display 216. According to an aspect of an embodiment, filter-list button 211, when activated, provides a drop down menu that displays a list of filters. A user may select one of the filters as an input. This input may be used as a query for the parameter-filtering system. Each filter may be made up of one or more search terms to be inputted as a query into the parameter-filtering system. Searching may be accomplished by searching through one or more standard parameter fields of a CDF information set. Examples of these fields—such as "name," which is the name of the particular parameter; or "default value," which is the default value of the parameter—are shown in Table 1 above. In one embodiment, the CDF information set will also be augmented by additional parameter fields intended to, among other intents, facilitate the searches. These additional parameter fields may be provided by the manufacturer (PDK author), user, or other third parties as separate files that augment the CDF information set. Examples of such fields may be a "description," which may be multi-line text in various formats to include a brief yet searchable description of the parameter and the like. Another example is a "keywords" field, which may be a space- or comma-delimited list of keywords used for searching. Users may be allowed to search in the augmented fields along with the standard parameter fields. The EDA tool, PDK file, or CDF augmenting file may prevent a user from searching certain parameter fields. Table 2 (below) shows an embodiment of the CDF fields shown in Table 1 (above) augmented with the newly added CDF fields (Description and Keywords) and a column indicating which fields are eligible for participation in a search via checkmarks.

Table 2

Searchable CDF Fields, and Augmented Fields

| Field | Description | Searchable Field |
|---|---|---|
| Name | Short name of parameter | ✓ |
| Prompt | Single line Longer name used as a GUI "hint" | ✓ |
| Description | Multi-line text (Rich Text/HTML subset) used for, "What's This?" help, search terms, filters, etc. | ✓ |
| Keywords | Space separated list of keywords, used for search, named filters, interactive filters etc. | ✓ |
| Default Value | Default value of parameter | |
| Choices | List of choices for enumerated types | ✓ |
| Type | Type of parameter/corresponding GUI element | |
| Display Expression | Programming code expression that determines display visibility of this parameter. | |
| Editable Expression | Programming code expression that determines edit-ability of this parameter (non-editable parameters are essentially temporary variables often containing intermediate expression results) | |
| Callback Expression | An expression/function in programming code called whenever the parameter value is interactively edited in the GUI | |

In one embodiment, the EDA software may use the description parameter field to present a descriptive tooltip. In one embodiment, the tooltip is shown when a user hovers a mouse pointer over a parameter of interest. In another embodiment, a "What's this?" may be shown (much like what is shown when the QWhatsThis class in the Qt framework is used). One skilled in the art would recognize that other searchable EDA-tool specific fields with different functionalities, which are not listed here, may be used as replacements for or in addition to the fields listed.

Referring back to FIG. 2, the filter list that is provided when clicking on filter-list button 211 may include 'pre-defined' filters which are part of the EDA software, or may include user-created custom filters. In an embodiment, pre-defined filters provided by the EDA tool vendors may be hardcoded to employ commonly used 'jargon' or terms (i.e. terms which are commonly used by those experienced in the art of IC design, such as 'layout dependent effects,' 'process migration,' etc.). In another embodiment, pre-defined filters may also be automatically and dynamically generated during EDA tool software initialization. In one embodiment, the pre-defined filters may be generated via the list of keywords found in the PDK. The EDA tool may count the keywords such that the commonly occurring keywords may be used in generating the pre-defined filters. In yet another embodiment, filters may be pre-defined by the EDA tool via the list of commonly occurring phrases (multiple words rather than one) occurring in the searchable fields across multiple components. Additional schemes or algorithms may be employed for synthesizing dynamic/automatic pre-defined filters without departing from the spirit of the art. In addition to the pre-defined filter fields, user-specific filters may additionally be added to extend the system, per an embodiment.

Filter-display field 210 may display the name of the filter that the user has selected. These filters may be one of the pre-defined filters, or may be a user-created filter. Create-filter button 213, when activated, may provide a user the ability to create or modify custom filters to be used as search queries for the parameter-filtering system. Create-filter button 213 may also provide the user the ability to delete custom filters. When creating a custom filter, the user may provide an identifier for the custom filter and search terms for use as the query. In one embodiment, the user may have the option to search in only selected parameter fields. If the user does not specify a search field, a default search setting, such as search all, may be used.

Figure 3:
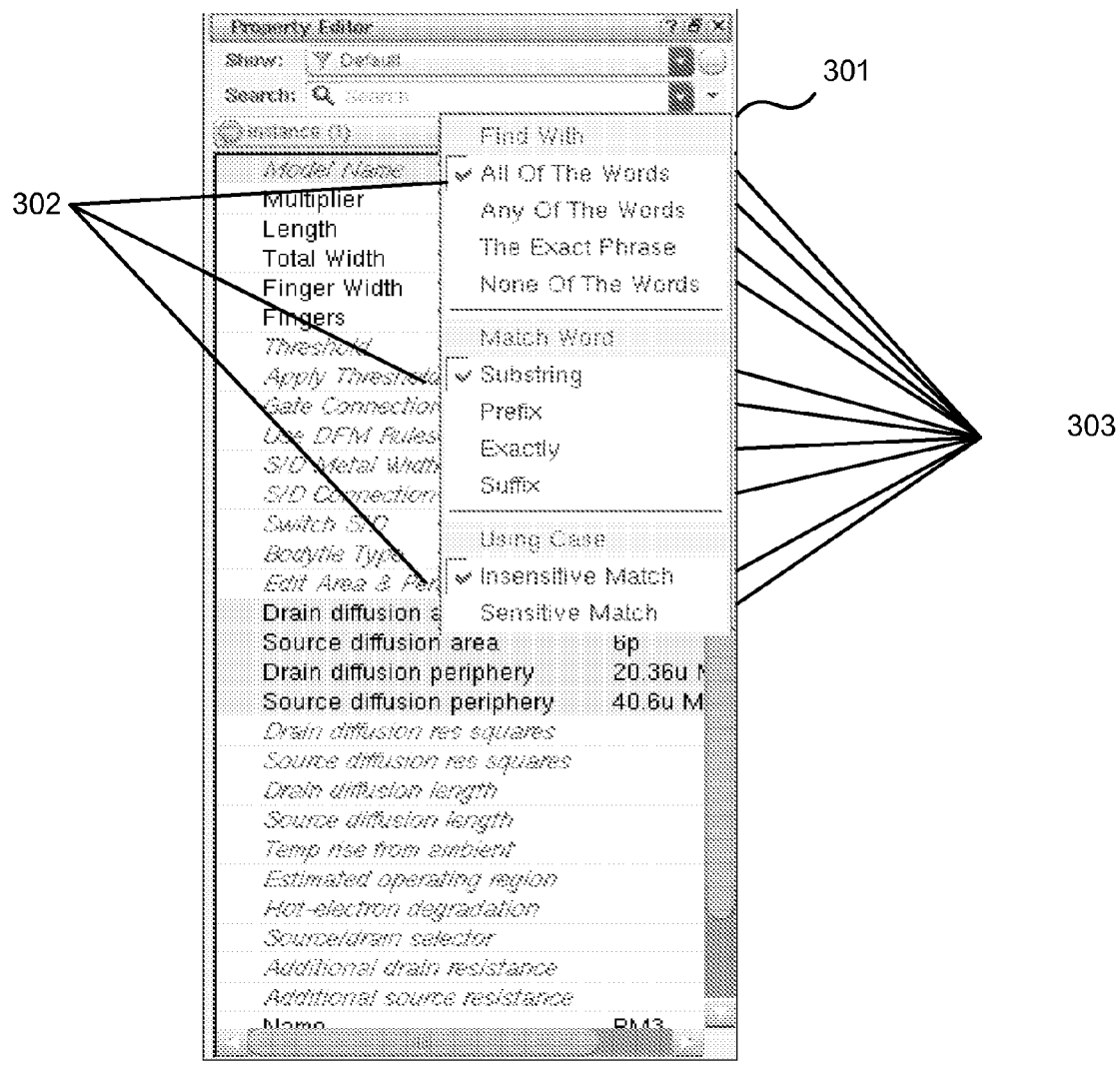
FIG. 3 is an exemplary window listing several search options within a Graphical User Interface of a parameter-filtering system according to an embodiment.

In addition to filtering the list of available parameters via the filter field 210, the filtered results may be further reduced via the dynamic search field 214. Search field 214 may accept user generated text strings ("search string") to be inputted as a query for the parameter-filtering system. Limit-search button 215 may provide the user the ability to select which parameter fields will be searched with the query. The user may also have the option to change the search methods used with the search string. Examples of these options may be searching for parameters that have a match for all search words, any of the words, exact phrases, or none of the words. Other options might determine whether matching words may or must be a substring, prefix, suffix, or exact matches. Additional options may be whether a search will be case sensitive. The user might also be able to do a combination of the optional search methods. FIG. 3 shows an exemplary GUI popup window 301 which provides check boxes 302 to identify which search instructions 303 will be applied to a search.

Referring back to FIG. 2, parameter display 216 displays a list of all the parameters with respect to a component. When a user inputs a query—by inputting either a provided filter, custom filter, search string, or both filter and search string—parameter display 216 will display only (or otherwise emphasize) the parameters that match the search terms in the query.

The user may select and edit one or more parameters in parameter display 216. The display may also provide an option to sort the parameters in a variety of manners. For example the parameters could be sorted alphabetically by name. When a user performs an action on parameter display 216 (e.g. right clicking), after selecting one or more parameters, the GUI may provide options to edit the values of the selected parameters. In one embodiment, a separate GUI window ("parameter-editing window") pops up to display the options.

Figure 4:
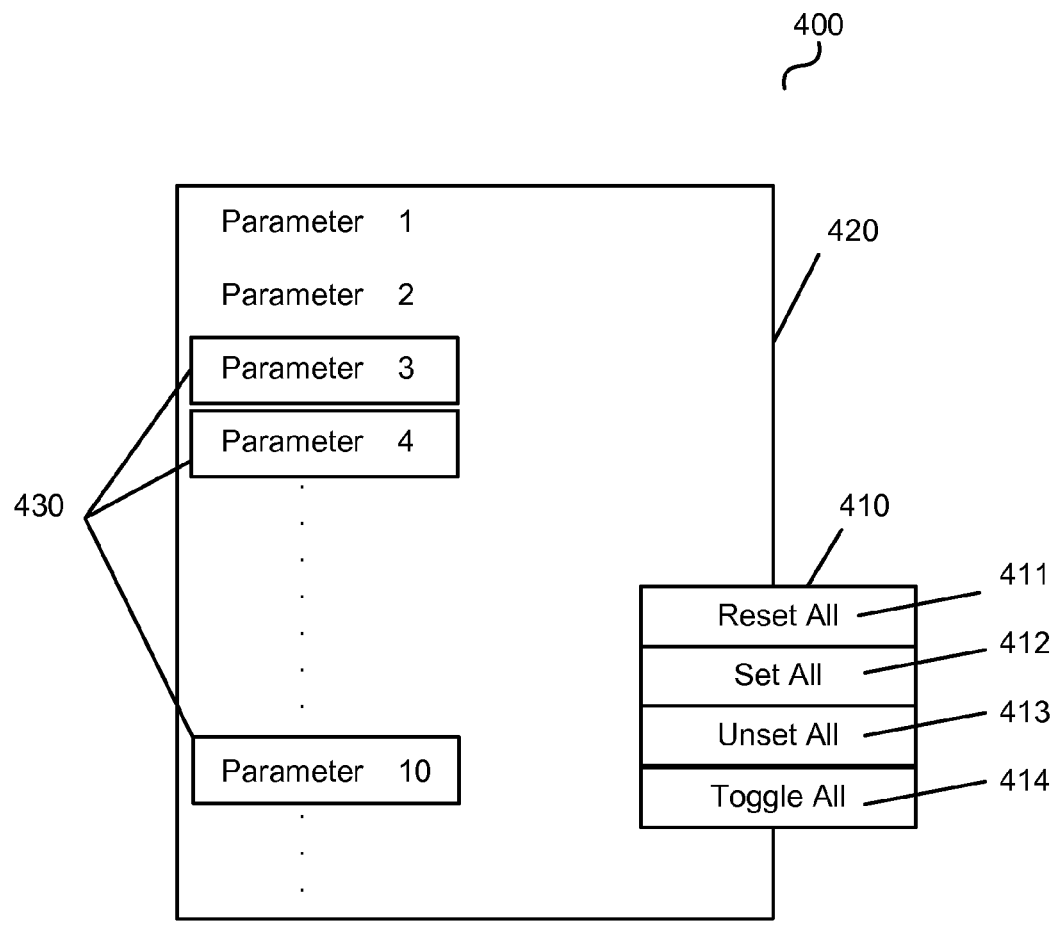
FIG. 4 illustrates an exemplary parameter-editing window provided within a Graphical User Interface of a parameter-filtering system according to an embodiment.

FIG. 4 illustrates an exemplary parameter-editing window 410, according to an embodiment. When a user performs an action on parameter display 420 (e.g. right clicking), this window is displayed. Parameter display 420 has several parameters encased in boxes 430 indicating which parameters have been selected. Editing window 410 may have one or more options of editing the selected parameters including, but not limited to, reset all 411, toggle all 412, and de-toggle all 413. Reset all 311 may reset all the selected parameters to their default values. Set all 312 may set all Boolean value settings in the selected parameters to 1. Unset all 313 may set all Boolean value settings in the selected parameters to 0. Toggle-all 414 may flip all Boolean value settings e.g. those that were True become False and vice versa.

In another aspect of an embodiment, user information may be provided to further augment or override some of the CDF information provided by the PDK supplier. According to an aspect of an embodiment, a separately stored user-authored Keywords Search Augmentation structure will augment the query with additional instructions for a search when searching for matching terms in a parameter field. The Keywords Search Augmentation structure may be one or more files provided by a manufacturer. It may also be user created, created by a third party, or any combination thereof. In one embodiment, the Keywords Search Augmentation structure may be editable by a user. The separately stored Keywords Search Augmentation structure may be stored in a serialization format. The following entry, in JSON format, is an example of a portion of a possible Keywords Search Augmentation structure which provides instructions that augment a search when searching through hypothetical parameter param_1 of hypothetical component nch_component_1. Though this example is written in JSON, any other programming language may be used.

```
Keyword Search Augmentation = {
  'nch_component_1:{
    'param_1' : {
      'additional_keywords' : ['LDE', 'Layout' 'Dependent'],
      'deleted_keywords' : ["lde"],
      'mapped_keywords' : {
        'masklayout' : ['mask', 'layoutmask'],
        'layers' : ['layerSet']
      }
      'mapped_regexp' : {
        'Mask' : ['(M|m)ask', 'm*sk']
      }
    }
  }
}
```

In this example, searching for the terms "LDE," "Layout," or "Dependent" in component nch_component_1 would discover parameter param_1. Additionally, if a filter were searching for "lde" (a lowercase version of "LDE"), the filter would not discover param_1 even if "lde" were originally in one of the parameter fields of param_1 as provided by the PDK supplier. Furthermore, a filter searching for the term "masklayout" or "layers" would discover param_1 if any of the parameter fields of param_1 (as provided by the PDK supplier) had the term "masklayout," "mask," "layoutmask," "layers," or "layerSet". Finally, a search for Mask would discover param_1 if any of the parameter fields of param_1 (as provided by the PDK supplier) matches the regular expression "(M|m)ask" or the regular expression "m*sk".

Figure 5:
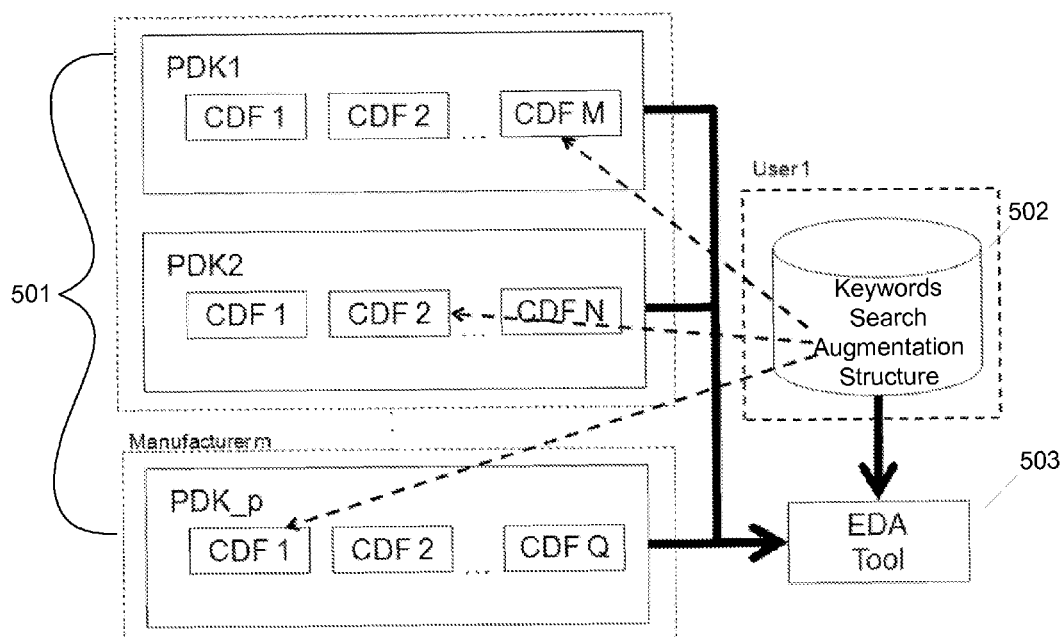
FIG. 5 is an exemplary diagram illustrating the associations of a Keywords Search Augmentation structure.

In an embodiment, the information provided by the Keywords Search Augmentation structure may be stored separately from the PDKs. This allows a user to associate a Keywords Search Augmentation structure with one or more PDKs (which may represent different manufacturing processes from different vendors or from different process nodes). FIG. 5 graphically describes one embodiment of this association. When multiple PDKs 501 are associated with a user-specified Keywords Search Augmentation structure 502, the augmented search can be applied to CDF parameter descriptions from multiple components (e.g. CDF1, CDF2) from multiple PDKs (e.g. PDK1, PDK2 . . . etc) by EDA tool 503. This advantageously allows a user to create a single unifying search scheme that can be used with similar results/intents across PDK's from multiple sources, regardless of the different nomenclature or search terms provided by the original PDK authors. This 'unifying search' implementation allows a user to create a search in the user's own terms, working across multiple PDKs and therefore reducing the user's cognitive burden.

The Keywords Search Augmentation structure may also augment a CDF's parameter field by adding additional parameter fields such as a "description" field to explain the parameter function in a natural language such as English. The field may initially be populated by a third party to explain the parameter. The explanation may be in plain text, multi-line text, html, rich text format, etc. Additionally, a user may add, replace, or delete the explanations. This provides a user with the ability to intuitively search for a parameter by knowing the parameter's function.

Figure 6:
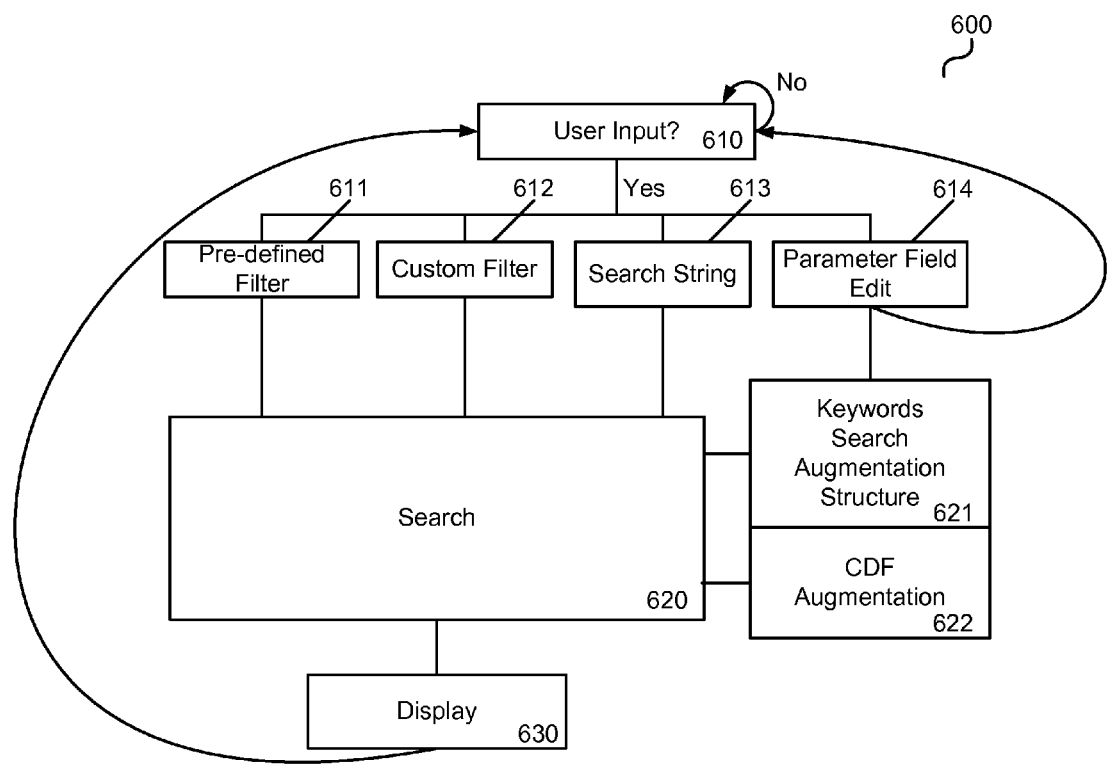
FIG. 6 is a flow diagram illustrating a parameter-filtering method according to an embodiment.

FIG. 6 is a flow diagram illustrating the parameter-filtering method once user input is provided according to an embodiment. Parameter-filtering system 600 of FIG. 6 starts with a user input 610. The input may be (1) a pre-defined filter 611, (2) a custom filter 612, (3) a search string 613, or (4) parameter field edit 614.

If the input is a pre-defined filter 611, the parameter-filtering system may do a search 620 on all of the parameter fields of all the parameters of a component—including any additional matching parameter fields in CDF Augmentation 622—for text that matches the search terms in the provided filter. If, however, the parameters have a matching Keywords Search Augmentation structure 621, search 620 will additionally apply the search instructions and mappings in the Keywords Search Augmentation structure 621 for each parameter when searching their parameter fields. All parameters with searchable parameter fields containing text that match the search terms (in accordance with the instructions in the Keywords Search Augmentation structure 621 if applicable) may then be considered for output to display 630. In another embodiment, the user may be provided the option not to use the Keywords Search Augmentation structure. Thus, all other parameters of the component may be hidden. The parameter-filtering system may then wait for another user input.

If the input is a custom filter 612, the search 620 will search the parameter fields in the same way as if the input were pre-defined filter 611. However, rather than searching all parameter fields, the search may be limited to certain parameter fields. For example, custom filter 612 may select only parameter field "explanation" to be searched. In such a case, only the "explanation" parameter field will be searched for the search terms in the custom filter. In an aspect of an embodiment, if the custom filter 612 does not select the use of any Keywords Search Augmentation structure, then the instructions in the Keywords Search Augmentation structure may not apply. Once the search is completed, all parameters identified in the search may then be considered for output to display 630. Thus, all other parameters of the component may be hidden. The parameter-filtering system may then wait for another user input. In another embodiment, instead of hiding parameters that did not match a search, the matching parameters would be emphasized in the list (or de-emphasize non-matching parameters). Matching parameters may be emphasized by highlighting, bolding, etc. One skilled in the art would understand that there are many ways to emphasize the matching parameters. Also in another embodiment, additional searches and filters may be applied to narrow a list of parameters that has already been narrowed by a previous search or filter.

If the input is a search string 613, the search is done in the same way as for a custom filter or pre-defined filter, using the search terms in search string 613. In another embodiment, searches by search string will also apply additional user-specified search instructions such as all of the words, any of the words, exact phrase, none of the words, substring, prefix, exactly, suffix, insensitive match, sensitive match. Once finished, the parameter-filtering system may wait for another user input.

If the input is a Parameter Field Edit 614, the parameter-filtering system may display any augmentations from a corresponding Keywords Search Augmentation 621 and CDF Augmentation 622 for the user to directly edit. Once finished, the parameter-filtering system may wait for another input from the user.

While embodiments of the present invention have been described, please note that various different modifications are possible and are contemplated within the true spirit and scope of the appended claims. There is no intention, therefore, of any limitations to the exact abstract or disclosure presented herein.

What is claimed is:

1. A processor-implemented method for managing parameters of a semiconductor component, a cell, a library of components, or a library of cells in electronic design automation (EDA) software to modify a functionality of an integrated circuit, the method comprising:
using a processor executing instructions to operate the EDA software:
receiving a query to the EDA software;
augmenting the query with at least a first search instruction stored in a first file;
augmenting a Component Description Format (CDF) file by the first file so that the augmented CDF file contains at least one additional field, wherein the CDF file is stored on a non-transitory computer readable medium, describes the component, cell, or library parameters, and contains parameter fields that have programming code that interacts with the EDA software via one of: (i) execution of the query with a scripting language binding that uses a design database of the integrated circuit or (ii) execution of the query with an application programming interface;
performing the augmented query in at least one field in the augmented CDF file;
determining whether there is at least one matching parameter within the component, cell, or library parameters based on the query; and
displaying and emphasizing the at least one matching parameter on a display,
wherein the first file is stored in a location external to the non-transitory computer readable medium and eligible for association with CDF files in addition to the CDF file stored on the non-transitory computer readable medium.

2. The method of claim 1, wherein the additional field comprises at least one of a searchable description and keywords for performing the query.

3. The method of claim 2 further comprising showing a descriptive tooltip when the user of the EDA software hovers a mouse pointer over a parameter of interest.

4. The method of claim L further comprising augmenting the CDF file by a second file external to the non-transitory computer readable medium storing the CDF file, and the first file to contain an additional field.

5. The method of claim 4 further comprising:
displaying a list of selectable filters on a graphical user interface (GUI) for the user of the EDA software in response to a user activation by the user of the EDA software; and
wherein receiving the query comprises retrieving one or more selected filters from the list of selectable filters.

6. The method of claim 5 wherein the list of selectable filters comprises one or more pre-defined filters provided by the EDA software.

7. The method of claim 6 further comprising using the processor to generate at least one of the pre-defined filters from at least one of the CDF file, the first file, and the second file.

8. The method of claim 5 wherein the list of selectable filters comprises one or more previously stored custom filters.

9. The method of claim 5 wherein the selectable filters comprise commonly occurring phrases occurring in multiple parameter fields across multiple components.

10. The method of claim 1, further comprising:
modifying the first search instruction with a second search instruction.

11. The method of claim 10 wherein the second search instruction is received by the processor with the query.

12. The method of claim 11 wherein the second search instruction comprises at least one search instruction specified by the user of the EDA software including at least one of: use all specified words, use any of the specified words, use a specified phrase exactly, use no specified words, specify case sensitivity, and search a specified word as one of a sub string, a prefix, an exact word, and a suffix.

13. The method of claim 11 wherein the second search instruction comprises a parameter field edit entered to the EDA software via a parameter editing window in a graphical user interface (GUI) to at least one of: reset all selected parameters to default values, and one of set, reset, and toggle all selected Boolean values.

14. The method of claim 1, further comprising:
using the processor executing instructions to operate the EDA software by:
determining a type of filter from the query, and
selecting at least one source file to be filtered by the query based on the type of the filter and the query.

15. The method of claim 14, wherein the type of filter is one of: a pre-defined filter, a custom filter, a search string, and a parameter field edit.

16. The method of claim 1, further comprising:
using the processor executing instructions to operate the EDA software by:
determining whether the query is activated for keyword augmentation, wherein the query is activated when query includes a term that matches a term in the first file,
when the query is activated:
augmenting the query with at least the first search instruction, and
performing the augmented query in the at least one field in the augmented CDF information set, and
when the first file is not activated:
performing the query in the at least one field in the augmented CDF information set,
wherein the first file is a keyword search augmentation structure file.

17. The method of claim 16, further comprising:
using the processor executing instructions to operate the EDA software by:
when the query is activated:
augmenting the CDF information set by the first file so that the augmented CDF file contains the at least one additional field.

18. A non-transitory computer readable medium storing instructions that, when executed by a processor, perform a method for managing parameters of a semiconductor component, a cell, a library of components, or a library of cells in electronic design automation (EDA) software to modify a functionality of an integrated circuit, the method comprising:
- while operating the EDA software and responsive to user input, receiving a query to the EDA software;
- augmenting the query with at least a first search instruction stored in a first file;
- augmenting a Component Description Format (CDF) information set by the first file so that the augmented CDF file contains at least one additional field, wherein the CDF information set is stored on a non-transitory computer readable medium, describes the component, cell, or library parameters, and contains parameter fields that have programming code that interacts with the EDA software via one of: (i) execution of the query with a scripting language binding that uses a design database of the integrated circuit or (ii) execution of the query with an application programming interface;
- performing the augmented query in at least one field in the augmented CDF information set;
- determining whether there is at least one matching parameter within the component, cell, or library parameters based on the query; and
- displaying and emphasizing the at least one matching parameter on a display,
- wherein the first file is stored in a location external to the non-transitory computer readable medium and eligible for association with CDF files in addition to the CDF file stored on the non-transitory computer readable medium.

19. The non-transitory computer readable medium of claim 18, wherein the additional field comprises at least one of a searchable description and keywords for performing the query.

20. The non-transitory computer readable medium of claim 18, further comprising augmenting the CDF information set by a second file separate from the CDF file and the first file to contain an additional field.

21. The non-transitory computer readable medium of claim 18, further comprising:
- modifying the first search instruction with a second search instruction.

22. The non-transitory computer readable medium of claim 21, wherein the second search instruction is within the query.

23. A system for managing parameters of a semiconductor component, a cell, a library of components, or a library of cells in electronic design automation (EDA) software to modify a functionality of an integrated circuit, the system comprising:
- a non-transitory computer readable medium for storing a Component Description Format (CDF) file that describes the component, cell, or library parameters and contains parameter fields that have programming code that interacts with the EDA software via one of: (i) execution of the query with a scripting language binding that uses a design database of the integrated circuit or (ii) execution of the query with an application programming interface and
- a processor executing instructions to operate the EDA software and to:
  - receive a query to the EDA software in response to input;
  - augment the query with at least a first search instruction stored in a first file;
  - augment the CDF file by the first file, to contain at least one additional field;
  - perform the augmented query in at least one field in the augmented CDF file;
  - determine whether there is at least one matching parameter within the component, cell, or library parameters based on the query; and
  - display and emphasize the at least one matching parameter on a display to facilitate creation of the integrated circuit,
- wherein the first file is stored in a location external to the non-transitory computer readable medium and eligible for association with CDF files in addition to the CDF file stored on the non-transitory computer readable medium.

24. The system of claim 23, wherein the processor further executes instructions to:
- modify the first search instruction with a second search instruction; and
- augment the query with the edited first search instruction.

25. The system of claim 24, wherein the second search instruction is part of the query.

* * * * *